United States Patent
Hirota et al.

(10) Patent No.: US 10,715,106 B2
(45) Date of Patent: Jul. 14, 2020

(54) RESONATOR AND RESONANCE DEVICE

(71) Applicant: Murata Manufacturing Co., Ltd., Nagaokakyo-shi, Kyoto-fu (JP)

(72) Inventors: Wakana Hirota, Nagaokakyo (JP); Toshio Nishimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 478 days.

(21) Appl. No.: 15/448,758

(22) Filed: Mar. 3, 2017

(65) Prior Publication Data

US 2017/0179926 A1    Jun. 22, 2017

Related U.S. Application Data

(63) Continuation of application No. PCT/JP2015/076230, filed on Sep. 16, 2015.

(30) Foreign Application Priority Data

Sep. 19, 2014  (JP) ................................. 2014-191600

(51) Int. Cl.
*H03H 9/21*    (2006.01)
*H03H 9/205*    (2006.01)
(Continued)

(52) U.S. Cl.
CPC ........... *H03H 9/205* (2013.01); *B06B 1/0603* (2013.01); *B06B 1/0607* (2013.01);
(Continued)

(58) Field of Classification Search
CPC .... H03H 9/205; H03H 9/2468; B06B 1/0603; B06B 1/0607
See application file for complete search history.

(56) References Cited

U.S. PATENT DOCUMENTS

| 5,325,574 A | 7/1994 | Takagi et al. |
| 5,451,828 A | 9/1995 | Tomikawa et al. |

(Continued)

FOREIGN PATENT DOCUMENTS

| JP | S53-145594 A | 12/1978 |
| JP | H01-202912 A | 8/1989 |

(Continued)

OTHER PUBLICATIONS

International Search Report issued in International Application No. PCT/JP2015/076230, dated Nov. 17, 2015.

(Continued)

*Primary Examiner* — J. San Martin
(74) *Attorney, Agent, or Firm* — Arent Fox LLP

(57) ABSTRACT

A resonator is provided that suppresses frequency variations with etching without decreasing the strength of vibration arms. The resonator includes a base portion, a first vibration portion extending from the base portion in a first direction and having a first width, and a second vibration portion extending from the base portion in the first direction with a first gap between the first and second vibration portions and having the first width. The first and second vibration portions perform out-of-plane bending vibration with opposite phases at a predetermined frequency. The predetermined frequency varies in accordance with the first width and the first gap. The ratio of the first gap to the first width is within a range that causes an absolute value of rates of variations in the predetermined frequency with respect to variations in the first width and in the first gap to be not more than about 100 ppm.

19 Claims, 8 Drawing Sheets

(51) Int. Cl.
*H03H 9/24* (2006.01)
*B06B 1/06* (2006.01)
*H03H 3/007* (2006.01)
*H03H 9/02* (2006.01)
*H03H 3/04* (2006.01)

(52) U.S. Cl.
CPC ........ *H03H 3/0078* (2013.01); *H03H 9/2468* (2013.01); *H03H 2003/0435* (2013.01); *H03H 2009/02511* (2013.01)

(56) References Cited

U.S. PATENT DOCUMENTS

| | | | | |
|---|---|---|---|---|
| 8,053,952 | B2* | 11/2011 | Takahashi | H03H 9/1021 310/312 |
| 8,212,454 | B2* | 7/2012 | Onitsuka | G04R 20/10 310/348 |
| 8,456,065 | B2* | 6/2013 | Amano | H03H 9/0595 310/344 |
| 8,803,407 | B2* | 8/2014 | Kawase | H03H 9/0519 310/344 |
| 2003/0056590 | A1* | 3/2003 | Yanagisawa | G01C 19/5607 73/504.16 |
| 2003/0168943 | A1* | 9/2003 | Matsuyama | H03H 9/1021 310/344 |
| 2003/0169118 | A1* | 9/2003 | Kawashima | H03H 3/02 331/158 |
| 2008/0211350 | A1 | 9/2008 | Tanaya et al. | |
| 2009/0015106 | A1* | 1/2009 | Tanaya | H03H 9/0595 310/344 |
| 2010/0148634 | A1* | 6/2010 | Ichikawa | H01L 41/053 310/348 |
| 2016/0072473 | A1* | 3/2016 | Nishimura | H03H 9/21 310/370 |
| 2016/0204334 | A1* | 7/2016 | Yamada | H01L 41/042 |
| 2017/0187351 | A1* | 6/2017 | Goto | B06B 1/0603 |
| 2018/0034441 | A1* | 2/2018 | Hirota | H03H 9/0595 |
| 2018/0048288 | A1* | 2/2018 | Hirota | H03H 9/24 |
| 2018/0175824 | A1* | 6/2018 | Hirota | H03H 9/0595 |
| 2019/0097600 | A1* | 3/2019 | Yoshii | H03H 3/0077 |

FOREIGN PATENT DOCUMENTS

| | | | |
|---|---|---|---|
| JP | H06-74834 A | | 3/1994 |
| JP | H07-83671 A | | 3/1995 |
| JP | 10160477 A | * | 6/1998 |
| JP | 2000-180173 A | | 6/2000 |
| JP | 2004-266764 A | | 9/2004 |
| JP | 2005-197946 A | | 7/2005 |
| JP | 2008-72705 A | | 3/2008 |
| JP | 2008-228334 A | | 9/2008 |
| JP | 2016176893 A | * | 10/2016 |

OTHER PUBLICATIONS

Written Opinion of the International Searching Authority issued in International Application No. PCT/JP2015/076230, dated Nov. 17, 2015.

* cited by examiner

RESONATOR AND RESONANCE DEVICE

CROSS REFERENCE TO RELATED APPLICATIONS

The present application is a continuation of PCT/JP2015/076230 filed Sep. 16, 2015, which claims priority to Japanese Patent Application No. 2014-191600, filed Sep. 19, 2014, the entire contents of each of which are incorporated herein by reference.

TECHNICAL FIELD

The present disclosure relates to a resonator and a resonance device.

BACKGROUND

In electronic devices, resonators have been used as devices for realizing a timekeeping function. Recently, with the reduction in the sizes of electronic devices, there has been a demand for a reduction in the sizes of resonators, and resonators that are manufactured by using micro-electromechanical systems (MEMS) technology (hereinafter referred to as MEMS resonators) have attracted attention.

In a MEMS resonator, the frequency of the MEMS resonator will vary as a result of the mass and the shape of a vibration arm varying in accordance with variations in etching time and in the concentration of an etching liquid. Consequently, there is a need to suppress such frequency variations.

Patent Document 1 (identified below) discloses a configuration for a resonator in which frequency variations that occur due to the influence of etching are suppressed in a bending-vibration-type resonator that causes a plurality of vibration arms to perform bending vibration.

Patent Document 1: Japanese Unexamined Patent Application Publication No. 2000-180173.

In the configuration described in Patent Document 1, by forming a recess at an end portion of each of the vibration arms, an increase in the frequency with a reduction in the mass of the end portions of the vibration arms and a decrease in the frequency with a reduction in the widths of the vibration arms cancel each other out such that the frequency variations are suppressed.

However, in the configuration in which the recesses are formed at the end portions of the vibration arms, the strength of each of the vibration arms decreases.

SUMMARY OF THE INVENTION

The present disclosure has been made in light of the above-described situation. It is an object of the present disclosure to provide a resonator that suppresses, without decreasing the strength of vibration arms, the frequency variations with etching in a resonator.

A resonator according to an exemplary aspect includes a base, a first vibration arm extending from the base in a first direction and having a first width, and a second vibration arm extending from the base in the first direction with a first gap between the second vibration arm and the first vibration arm and the second vibration arm having the first width. Moreover, the first vibration arm and the second vibration arm perform out-of-plane bending vibration with opposite phases at a predetermined frequency when a potential is applied thereto. The predetermined frequency varies in accordance with the first width and the first gap, and a ratio of the first gap to the first width is within a range that causes an absolute value of rates of variations in the predetermined frequency with respect to variations in the first width and in the first gap to be not more than about 100 ppm.

According to the disclosed resonator, frequency variations with etching can be suppressed without decreasing the strength of vibration arms.

DETAILED DESCRIPTION OF THE EXEMPLARY EMBODIMENTS

Figure 1:
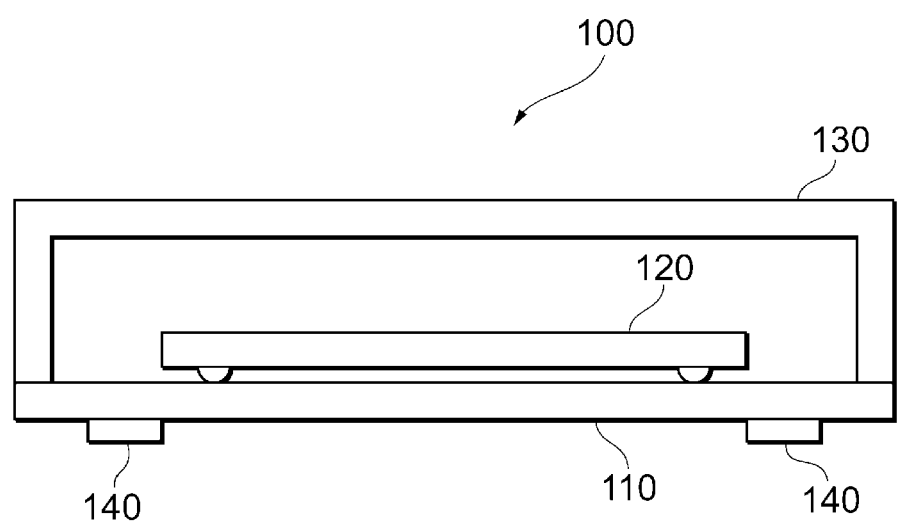
FIG. 1 is a diagram illustrating an example of the schematic structure of a resonance device according to an exemplary embodiment.

Embodiments of the present invention will be described below with reference to the drawings. FIG. 1 is a diagram illustrating an example of the schematic structure of a resonance device according to an exemplary embodiment. As illustrated in FIG. 1, a resonance device 100 is a resonance device that includes a substrate 110, a resonator 120, a cover 130, and an outer electrode 140. Preferably, the resonator 120 is a MEMS resonator manufactured by using the MEMS technology. The cover 130 is made of, for example, silicon and covers the resonator 120. The outer electrode 140 is a metal electrode used for electrically connecting an element outside the resonance device 100 and the resonator 120 to each other.

Figure 2:
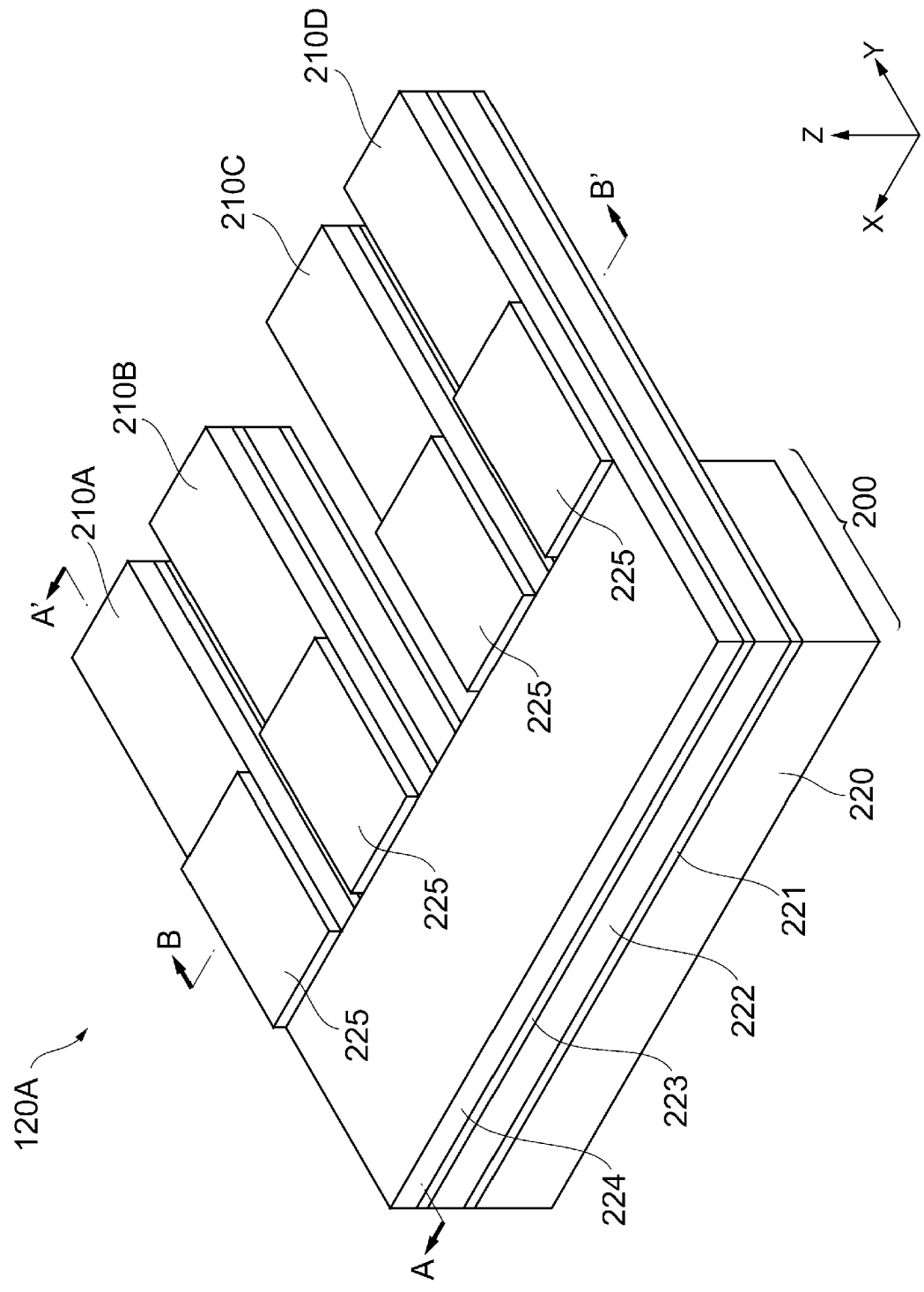
FIG. 2 is a perspective view of a resonator 120A, which is an example of a resonator 120.
Figure 3:
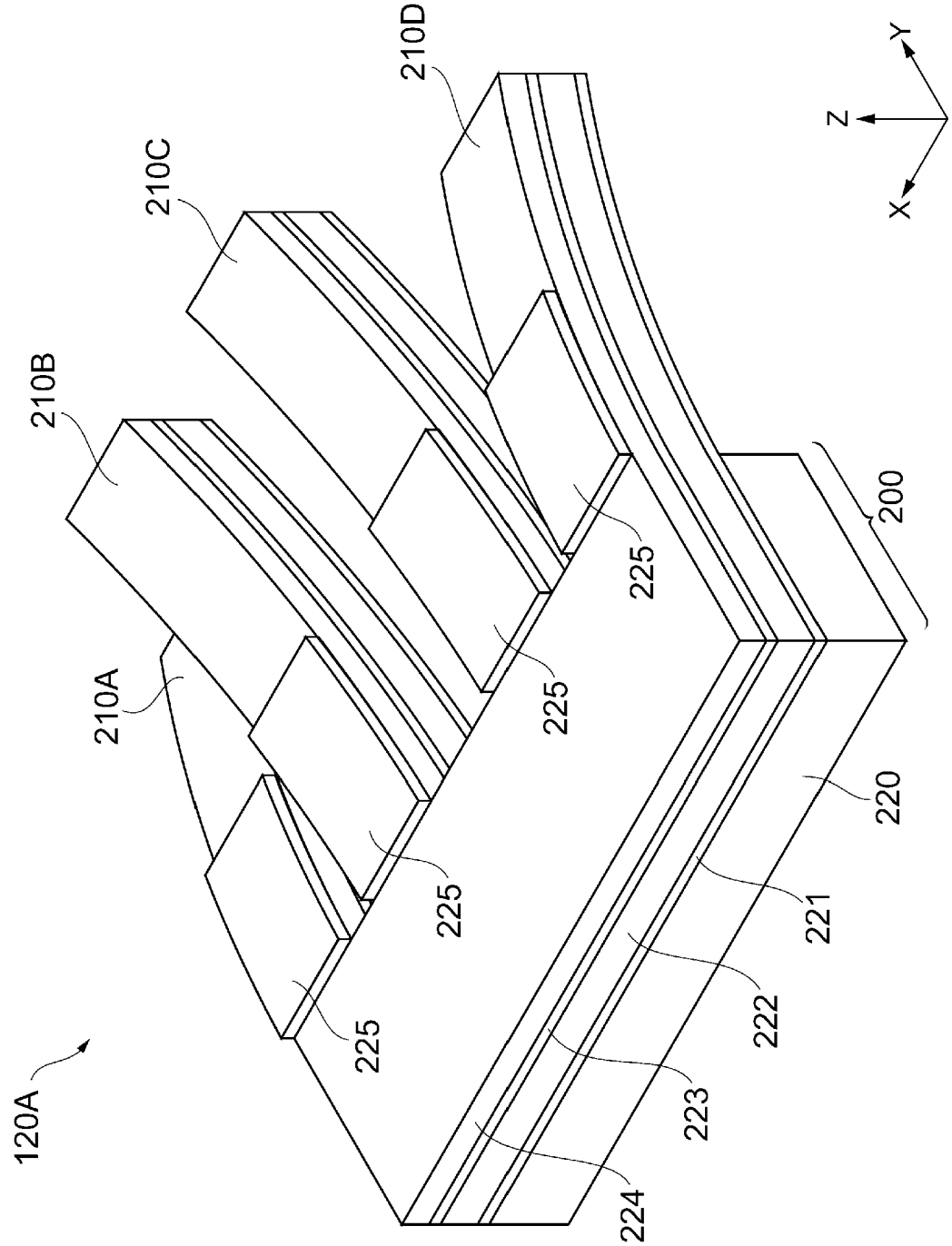
FIG. 3 is a diagram illustrating a state where bending vibration is performed in the resonator 120A.
Figure 4:
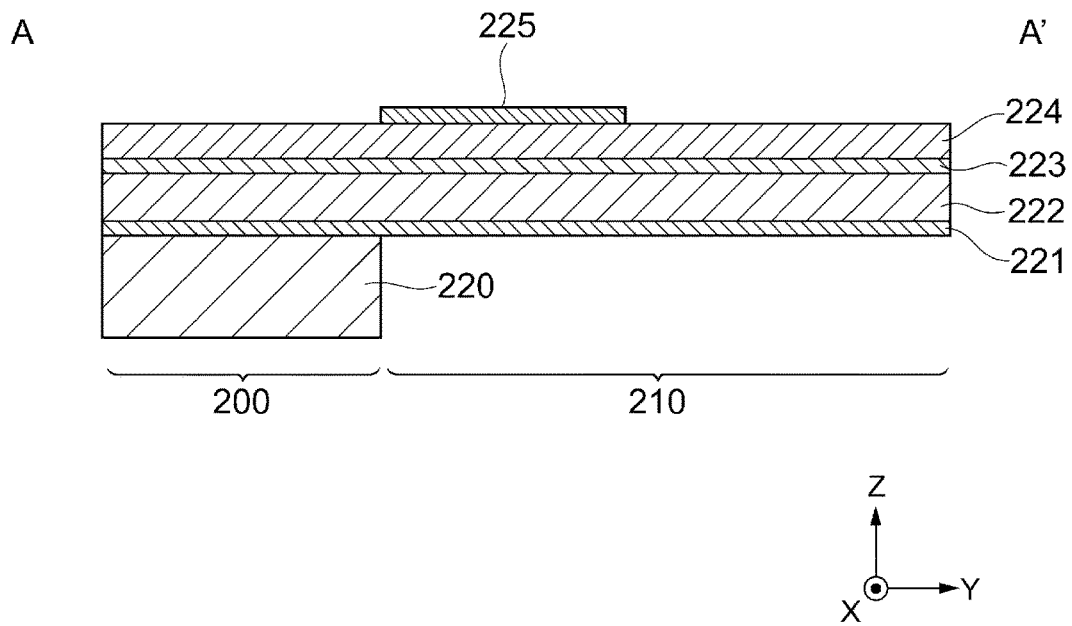
FIG. 4 is a cross-sectional view taken along line A-A' of FIG. 2.
Figure 5:
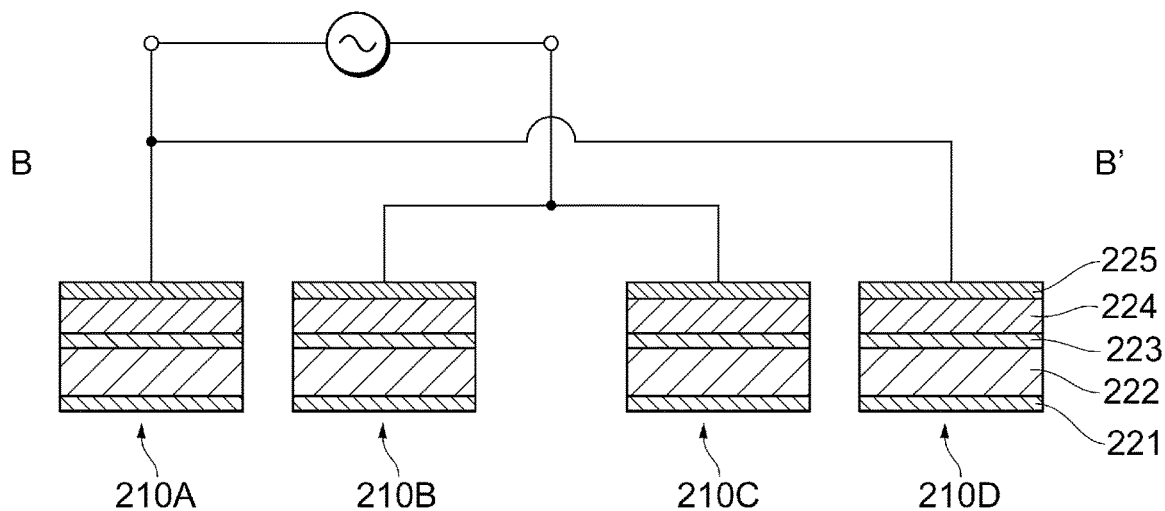
FIG. 5 is a cross-sectional view taken along line B-B' of FIG. 2.
Figure 6:
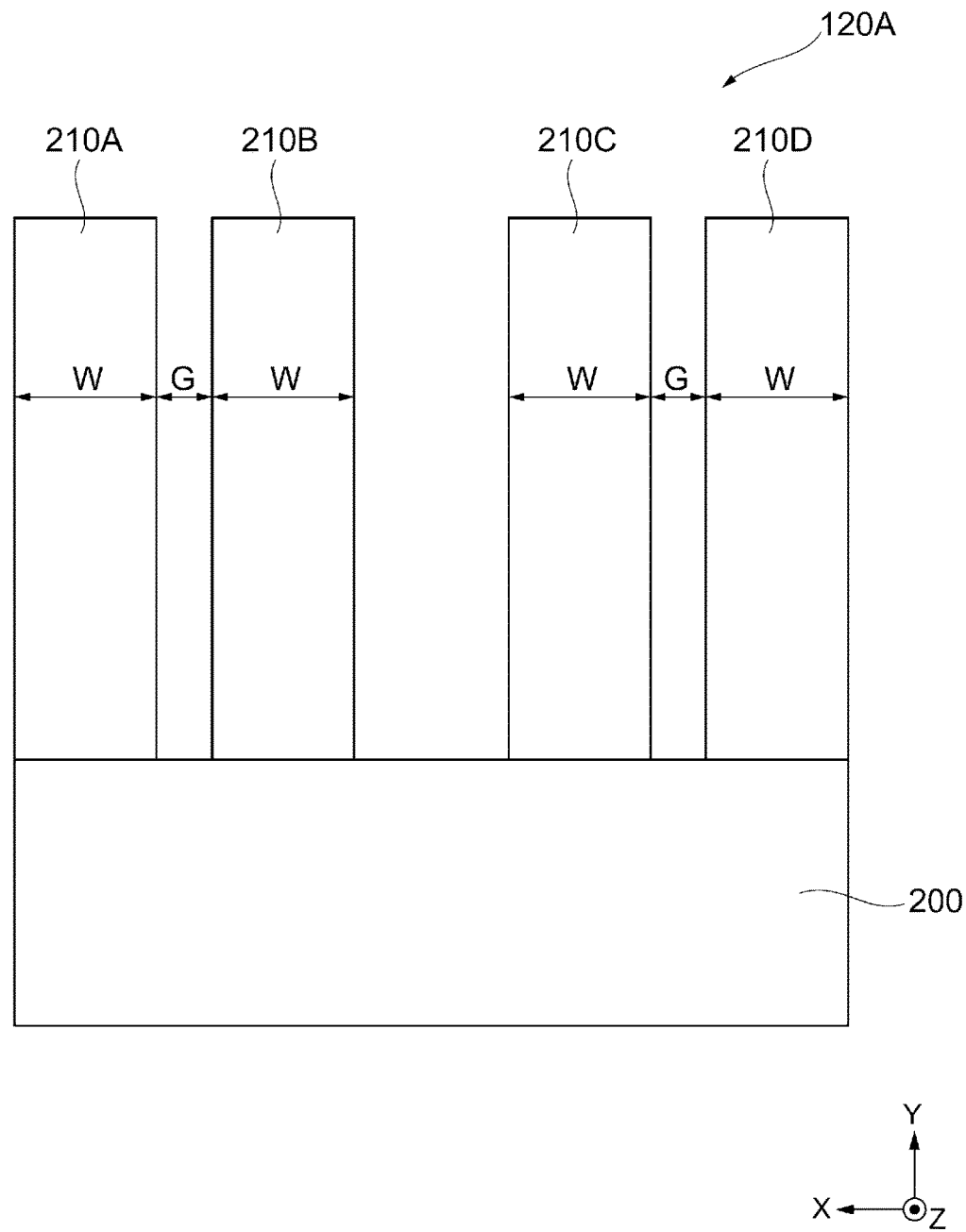
FIG. 6 is a diagram illustrating the resonator 120A when viewed from the top surface (from the positive Z-axis direction).

An exemplary configuration example of the resonator 120 will now be described with reference to FIG. 2 to FIG. 6. FIG. 2 is a perspective view of a resonator 120A, which is an example of the resonator 120. FIG. 3 is a diagram illustrating a state where bending vibration is performed in the resonator 120A. FIG. 4 is a cross-sectional view taken along line A-A' of FIG. 2. FIG. 5 is a cross-sectional view taken along line B-B' of FIG. 2. FIG. 6 is a diagram illustrating the resonator 120A when viewed from the top surface (from the positive Z-axis direction).

As illustrated in FIG. 2, the resonator 120A includes a base or base portion 200 and vibration arms 210 (210A to 210D). The base portion 200 and the vibration arms 210 are formed through MEMS processes including etching.

The base portion 200 is a structure that supports the vibration arms 210. As illustrated in FIG. 2 and FIG. 4, in the base portion 200, a silicon oxide layer 221, a silicon layer 222, a lower electrode 223, and a piezoelectric layer 224 are stacked on a silicon member 220.

As illustrated in FIG. 2 and FIG. 4, the vibration arms 210 are formed as a result of portions of the silicon oxide layer 221, the silicon layer 222, the lower electrode 223, and the piezoelectric layer 224 extending from the base portion 200 in a predetermined direction (first direction: the Y-axis direction). The vibration arms 210 include upper electrodes 225 stacked on the piezoelectric layer 224.

As illustrated in FIG. 3, the vibration arms 210 perform bending vibration at a predetermined frequency in a direction (the Z-axis direction in FIG. 3) perpendicular to a plane (XY plane) including the vibration arms 210A to 210D. In order to reduce a probability that a torsional moment will be generated in the base portion 200 due to vibration of the vibration arms 210A to 210D, the two outer vibration arms 210A and 210D and the two inner vibration arms 210B and 210C vibrate with opposite phases as illustrated in FIG. 3. It is noted that the number of the vibration arms is not limited to four and may be any number that is two or larger according to alternative embodiments.

The silicon oxide layer 221 is made of, for example, silicon oxide such as $SiO_2$. In a certain temperature range, the frequency-temperature characteristics of silicon oxide vary in a manner opposite to that in which the frequency-temperature characteristics of silicon vary. Thus, as a result of the vibration arms 210 including the silicon oxide layer 221, variations in the frequency characteristics of the silicon layer 222 and variations in the frequency characteristics of the silicon oxide layer 221 cancel each other out. As a result, the frequency-temperature characteristics can be improved.

The silicon layer 222 is made of silicon. Note that the silicon layer 222 can include, for example, phosphorus (P), arsenic (As), or antimony (Sb) as an n-type dopant (donor). In addition, the silicon layer 222 may include a p-type dopant (acceptor). The silicon layer 222 may be a degenerate semiconductor in which such a dopant has been injected at a concentration of $1 \times 10^{19}$ cm$^{-3}$ or more.

The upper electrodes 225 and the lower electrode 223 are metal electrodes. The upper electrodes 225 and the lower electrode 223 are made of, for example, molybdenum (Mo) or aluminum (Al). It is noted that, when the silicon layer 222 is a degenerate semiconductor, the silicon layer 222 can function as a lower electrode without providing the lower electrode 223.

Preferably, the piezoelectric layer 224 is a piezoelectric thin film that converts a voltage applied thereto into vibration. The piezoelectric layer 224 can contain, for example, aluminum nitride as a main component. More specifically, for example, the piezoelectric layer 224 can be made of scandium aluminum nitride (ScAlN). ScAlN is obtained by substituting some of aluminum (Al) in aluminum nitride (AlN) with scandium (Sc). For example, ScAlN used in the piezoelectric layer 224 can be obtained by substituting Al with Sc such that ScAlN contains about 40 atomic % of Sc when the atomic concentration, which is the sum of the number of atoms of Al and the number of atoms of Sc, is 100 atomic %.

During operation, the piezoelectric layer 224 expands and contracts in an in-plane direction (the Y-axis direction) of the plane (XY plane) including the vibration arms 210 in accordance with the voltage applied between the upper electrodes 225 and the lower electrode 223. The vibration arms 210 are bent and displaced in the direction (the Z-axis direction) perpendicular to the XY plane in response to the expansion and contraction of the piezoelectric layer 224.

As illustrated in FIG. 5, in the resonator 120A, the potential applied to the upper electrodes 225 of the vibration arms 210A and 210D and the potential applied to the vibration arms 210B and 210C have opposite phases. Note that the portions of the lower electrode 223 included in the vibration arms 210A to 210D are connected to one another in the base portion 200 and have the same potential (e.g., ground potential). Thus, the electric field applied to the portions of the piezoelectric layer 224 included in the vibration arms 210A and 210D and the electric field applied to the portions of the piezoelectric layer 224 included in the vibration arms 210B and 210C are oriented in opposite directions. As a result, as illustrated in FIG. 3, the vibration arms 210A and 210D and the vibration arms 210B and 210C perform bending vibration with opposite phases.

As illustrated in FIG. 6, each of the vibration arms 210 has the same width W (first width). A gap G (first gap) is formed between the vibration arm 210A (referred to as a first vibration portion) and the vibration arm 210B (referred to as a second vibration portion). Similarly, another gap G (referred to as a first gap) is formed between the vibration arm 210C (referred to as a third vibration portion) and the vibration arm 210D (referred to as a fourth vibration portion). It is noted that the gap (referred to as a second gap) formed between the vibration arm 210B and the vibration arm 210C may be the same as or different from the gap G (i.e., the first gap) between the vibration arm 210A and the vibration arm 210B.

In one exemplary aspect, the vibration arms 210 are formed by performing an etching operation, and the width W and the gaps G vary in accordance with variations in etching time and in the concentration of an etching liquid. For example, when the etching time increases, the width W is decreased, and the gaps G are increased. A decrease in the width W causes a decrease in the mass of the vibration arms 210, and thus, the frequency of the resonator 120A increases. In contrast, an increase in the gaps G causes loose vibration coupling between adjacent vibration arms 210 (e.g., the vibration arm 210A and the vibration arm 210B), and thus, the frequency of the resonator 120A decreases.

As described above, in the vibration arms 210, frequency variations with variations in the width W and frequency variations with variations in the gaps G have opposite characteristics. Accordingly, the inventors of the present application understand that by appropriately designing the width W and the gaps G, frequency variations with variations in the width W and frequency variations with variations in the gaps G cancel each other out such that variations in the frequency of the resonator 120A can be suppressed.

Figure 7:
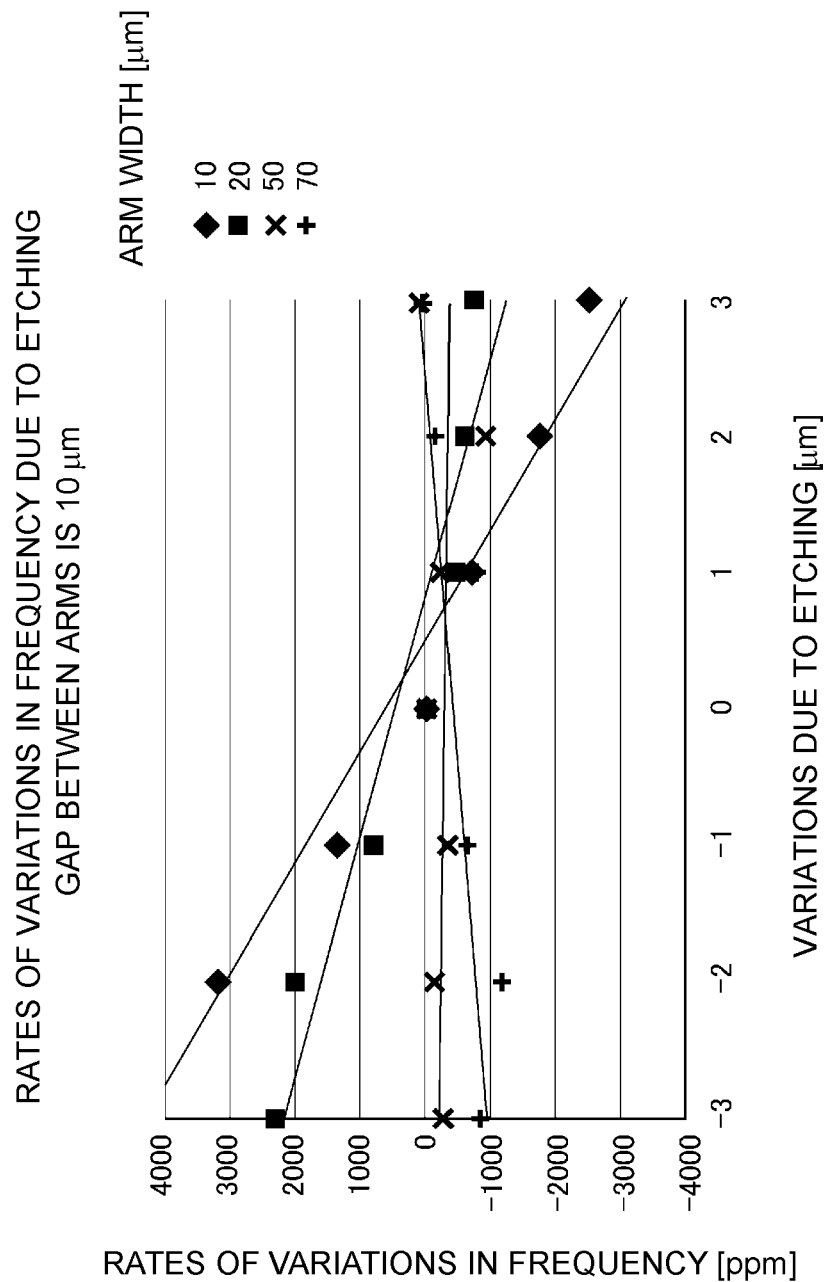
FIG. 7 is a graph denoting simulation results showing rates of variations in frequency associated with variations in a width W caused by etching when the design value of each gap G between vibration arms 210 is set to 10 μm.

FIG. 7 is a graph denoting simulation results showing rates of variations in frequency associated with variations in the width W caused by etching when the design value of each of the gaps G in the vibration arms 210 is set to 10 μm. In FIG. 7, the horizontal axis denotes variation amount (μm) with respect to the design value of the width W, and the vertical axis denotes rates of variations in frequency (ppm, i.e., parts per million). In FIG. 7, simulation results showing rates of variations in frequency associated with variations in the width W when the design value of the width W is set to one of 10 μm, 20 μm, 50 μm, and 70 μm. As illustrated in FIG. 7, when the design value of the width W is set to 10 μm or 20 μm, the frequency decreases with an increase in the width W. Moreover, when the design value of the width W is set to 70 μm, the frequency increases with an increase in the width W. In contrast, the rate of variations in frequency associated with variations in the width W when the design value of the width W is set to 50 μm is smaller than that when the design value of the width W is set to one of the other design values. In other words, it is understood from the simulation results that the frequency variations with etching can be suppressed by setting the gap G/width W ratio to about 0.2 (=10 μm/50 μm). It is noted that the term "about" or "approximately" is used herein to account for minor variations that may occur during manufacturing.

Figure 8:
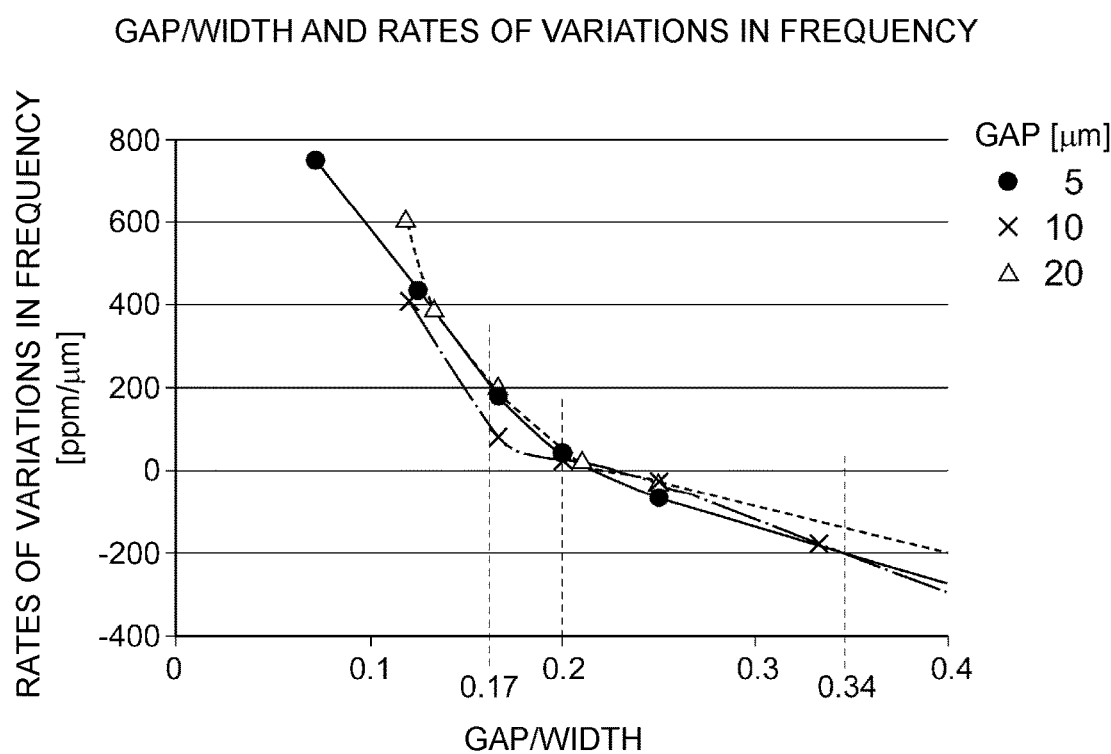
FIG. 8 is a graph denoting simulation results showing the relationship between gap G/width W and rates of variations in frequency.

FIG. 8 is a graph denoting simulation results showing the relationship between the gap G/width W ratio and rates of variations in frequency. In FIG. 8, the horizontal axis denotes the gap G/width W ratio, and the vertical axis denotes rates of variations in frequency with respect to variation amounts of the width W (ppm/μm). FIG. 8 denotes simulation results showing rates of variations in frequency with respect to variation amounts of the width W with variations in the gap G/width W ratio when the thickness of the silicon layer 222 of the vibration arms 210 is set to 5 μm, and where the design value of each of the gaps G is set to one of 5 μm, 10 μm, and 20 μm. It is noted that similar results can be obtained when the thickness of the silicon layer 222 of the vibration arms 210 is set to 10 μm.

Here, for example, it is often required that a common crystal resonator, which is used for a timekeeping function, have characteristics that cause the absolute value of rates of variations in frequency to be about 100 ppm or lower. Thus, also in the resonator 120A, by designing the gap G/width W ratio such that the absolute value of rates of variations in the frequency is about 100 ppm or lower, characteristics equivalent to those of a common crystal resonator can be obtained. The variations in the shape of the resonator 120A that occur in etching of the MEMS processes are within a range of about ±0.5 μm. Thus, by setting the absolute value of rates of variations in the frequency with respect to the variation amounts of the width W (ppm/μm) to about 200 ppm/μm or lower, the absolute value of rates of variations in the frequency (ppm) can be about 100 ppm or lower.

As illustrated in FIG. 8, the absolute value of rates of variations in the frequency with respect to the variation amounts of the width W (ppm/μm) is 200 ppm/μm or lower when the gap G/width W ratio is about 0.17 or larger and about 0.34 or smaller. Thus, by designing each of the gaps G and the width W such that the gap G/width W ratio is about 0.17 or larger and about 0.34 or smaller, the absolute value of rates of variations in the frequency (ppm) in the resonator 120A can be set to about 100 ppm or lower.

In addition, as illustrated in FIG. 8, when the gap G/width W ratio is about 0.20 or larger and about 0.34 or smaller, the slope of the curve is gentler (i.e., less steep) than when the gap G/width W ratio is about 0.17 or larger and about 0.20 or smaller. Thus, by designing each of the gaps G and the width W such that the gap G/width W ratio is about 0.20 or larger and about 0.34 or smaller, frequency variations that occur at the time of mass production of the resonator 120A can be further reduced.

Figure 9:
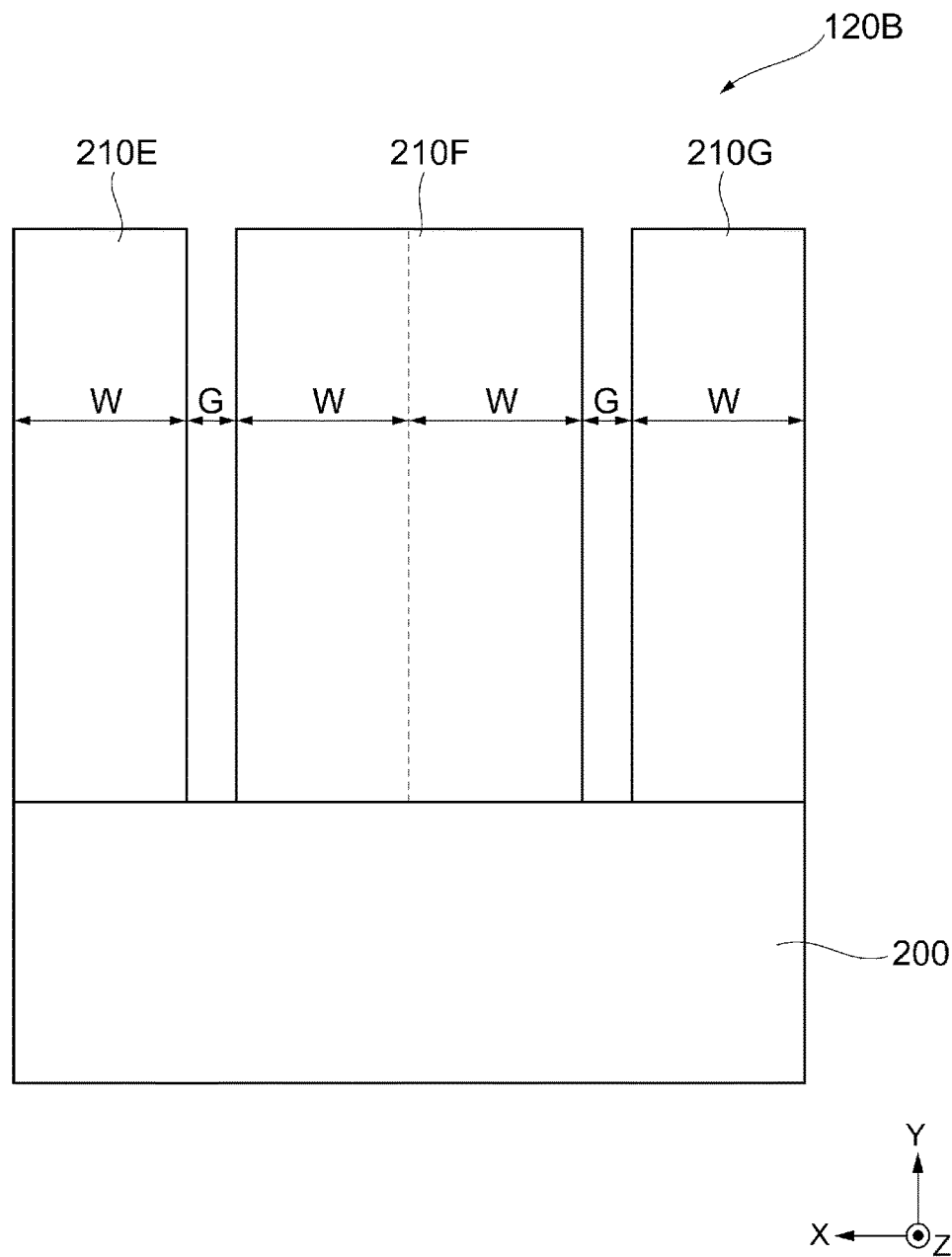
FIG. 9 is a diagram illustrating the configuration of a resonator 120B, which is another configuration example of the resonator 120.

FIG. 9 is a diagram illustrating the configuration of a resonator 120B, which is another configuration example of the resonator 120. Note that the elements the same as those of the resonator 120A are denoted by the same reference numerals, and descriptions thereof will be omitted. Similar to FIG. 6, FIG. 9 is a diagram illustrating the resonator 120B when viewed from the top surface (from the positive Z-axis direction). As illustrated in FIG. 9, the resonator 120B includes vibration arms 210E to 210G. The vibration arms 210E and 210G have the same width (W), and the vibration arm 210F has a width (2W), which is twice the width (W). A gap G is formed between the vibration arm 210E and the vibration arm 210F. Similarly, another gap G is formed between the vibration arm 210F and the vibration arm 210G. In the resonator 120B, the vibration arms 210E and 210G and the vibration arm 210F perform bending vibration with opposite phases. In other words, the vibration arms 210E and 210G correspond to the vibration arms 210A and 210D of the resonator 120A. The vibration arm 210F corresponds to a vibration arm obtained by integrally forming the vibration arms 210B and 210C while the gap (i.e., the second gap) between the vibration arm 210B (i.e., the second vibration portion) and the vibration arm 210C (i.e., the third vibration portion) of the resonator 120A is zero.

As in the case of the resonator 120A, also in the resonator 120B, frequency variations with etching can be suppressed by designing the gap G/width W ratio within a range that causes the absolute value of rates of variations in frequency (ppm) associated with variations in the shapes of the vibration arms 210E to 210G that occur due to etching to be about 100 ppm or lower.

Exemplary embodiments of the present invention have been described above. According to the embodiments, by designing the gap G/width W ratio within a range that causes the absolute value of rates of variations in frequency associated with variations in the shapes of the vibration portions 210 that occur due to etching to be about 100 ppm or lower, frequency variations with etching can be suppressed without causing a decrease in the strength of the vibration portions.

More specifically, for example, in the resonator 120A illustrated in FIG. 2 as an example, which includes the four vibration arms 210A to 210D that perform bending vibration, by designing the gap G/width W ratio in the manner described above, the frequency variations with etching can be suppressed.

In addition, for example, in the resonator 120B illustrated in FIG. 9 as an example, which includes the three vibration arms 210E to 210G that perform bending vibration, by designing the gap G/width W ratio in the manner described above, the frequency variations with etching can be suppressed.

As illustrated in FIG. 8 as an example, by setting the gap G/width W ratio to be about 0.17 or larger and about 0.34 or smaller, the absolute value of rates of variations in frequency associated with variations in the shapes of the vibration portions 210 that occur due to etching can be set to about 100 ppm or lower.

In addition, as illustrated in FIG. 8 as an example, by setting the gap G/width W ratio to be about 0.20 or larger and about 0.34 or smaller, frequency variations can be further reduced.

It is noted that the embodiments have been described above for ease of understanding of the present invention and are not intended to limit the scope of the present invention. Moreover, it should be appreciated that changes and improvements may be made to the present disclosure within the scope of the present invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes and the like of the elements are not limited to those described above as examples, and they may be suitably changed. In addition, the elements included in the exemplary embodiments can be combined with each other as long as it is technically possible, and such combinations are also within the scope of the present invention as long as the combinations have the features of the present invention.

REFERENCE SIGNS LIST 100 resonance device
110 substrate
120 resonator
130 cover
140 outer electrode
200 base portion
210 vibration arm
220 silicon member
221 silicon oxide layer
222 silicon layer
223 lower electrode
224 piezoelectric layer
225 upper electrode

The invention claimed is:

1. A resonator comprising:
a base;
a first vibration arm extending from the base in a first direction, the first vibration arm having a first width; and
a second vibration arm extending from the base in the first direction with a first gap between the first and second vibration arms;
a third vibration arm extending from the base in the first direction adjacent to the second vibration arm; and
a fourth vibration arm extending from the base in the first direction with a gap between the fourth vibration arm and the third vibration arm,
wherein the first and second vibration arms are configured to perform out-of-plane bending vibration with opposite phases at a predetermined frequency when a potential is applied thereto,
wherein the first and second vibration arms are configured to perform the out-of-plane bending vibration in a thickness direction of the resonator, and
wherein a ratio of a width of the first gap to the first width of the first vibration arm is within a range that configures the resonator to have an absolute value of rates of variations in the predetermined frequency with respect to variations in the first width and in the width of the first gap to be approximately 100 ppm or less.

2. The resonator according to claim 1, wherein the predetermined frequency varies in accordance with the first width and the width of the first gap.

3. The resonator according to claim 1, wherein the second vibration arm has the first width.

4. The resonator according to claim 1, wherein the width of the first vibration arm extends in a second direction perpendicular to the first direction.

5. The resonator according to claim 1, wherein the gap between the fourth vibration arm and the third vibration arm has a width approximately equal to the width of the first gap.

6. The resonator according to claim 1, wherein each of the third and fourth vibration arms have the first width.

7. The resonator according to claim 6, wherein the third vibration arm extends from the base in the first direction with a second gap between the third vibration arm and the second vibration arm.

8. The resonator according to claim 7, wherein the second gap has a width that is wider than the first gap.

9. The resonator according to claim 6, wherein the first and fourth vibration arms and the second and third vibration arms are configured to perform out-of-plane bending vibration with opposite phases at the predetermined frequency when the potential is applied thereto.

10. The resonator according to claim 6, wherein the second and third vibration arms are integrally formed with each other.

11. The resonator according to claim 1, wherein the ratio of the width of the first gap to the first width of the first vibration arm is not less than approximately 0.17 and not more than approximately 0.34.

12. The resonator according to claim 11, wherein the ratio of the width of the first gap to the first width of the first vibration arm is not less than approximately 0.20 and not more than approximately 0.34.

13. A resonance device comprising:
the resonator according to claim 1;
a cover covering the resonator; and
an outer electrode.

14. A resonator comprising:
a base;
a first pair of vibration arms that extend from the base in the first direction with a first gap disposed therebetween, the first pair of vibration arms being configured to vibrate with opposite phases relative to each other at a predetermined frequency when a potential is applied thereto; and
a second pair of first vibration arms that extend from the base in the first direction with a second gap disposed therebetween, the second pair of vibration arms being configured to vibrate with opposite phases relative to each other at the predetermined frequency when the potential is applied thereto,
wherein each of the vibration arms of the first and second pairs have a same first width,
wherein the first gap and the second gap have a same second width, and
wherein a ratio of the second width to the first width is within a range, such that resonator has an absolute value of rates of variations in the predetermined frequency with respect to variations in the first width and the second width that is approximately 100 ppm or less.

15. The resonator according to claim 14, wherein the ratio is not less than approximately 0.17 and not more than approximately 0.34.

16. The resonator according to claim 15, wherein the ratio is not less than approximately 0.20 and not more than approximately 0.34.

17. The resonator according to claim 14, wherein one of the first pair of vibration arms and one of the second pair of vibration arms are integrally formed with each other.

18. The resonator according to claim 14, wherein a gap between the first pair of vibration arms and the second pair of vibration arms has a width larger than the second width of the first and second gaps.

19. The resonator according to claim 1, wherein the first and second vibration arms extend in a planar direction such that the thickness direction of the resonator is in a direction normal to the planar direction.

* * * * *